United States Patent
Nishita et al.

(10) Patent No.: US 12,437,994 B2
(45) Date of Patent: Oct. 7, 2025

(54) PROTECTIVE FILM-FORMING COMPOSITION CONTAINING DIOL STRUCTURE

(71) Applicant: NISSAN CHEMICAL CORPORATION, Tokyo (JP)

(72) Inventors: Tokio Nishita, Toyama (JP); Yuto Hashimoto, Toyama (JP); Yuki Endo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 420 days.

(21) Appl. No.: 17/926,033

(22) PCT Filed: Jun. 11, 2021

(86) PCT No.: PCT/JP2021/022277
§ 371 (c)(1),
(2) Date: Nov. 17, 2022

(87) PCT Pub. No.: WO2021/251481
PCT Pub. Date: Dec. 16, 2021

(65) Prior Publication Data
US 2023/0187208 A1  Jun. 15, 2023

(30) Foreign Application Priority Data
Jun. 12, 2020 (JP) .................... 2020-102045

(51) Int. Cl.
*H01L 21/027* (2006.01)
*C07D 303/16* (2006.01)
(Continued)

(52) U.S. Cl.
CPC ........ *H01L 21/0275* (2013.01); *C07D 303/16* (2013.01); *C07D 303/27* (2013.01); *H01L 21/30604* (2013.01)

(58) Field of Classification Search
CPC ........... H01L 21/0275; H01L 21/30604; H01L 21/3081; H01L 21/3086; H01L 21/31111;
(Continued)

(56) References Cited

U.S. PATENT DOCUMENTS

2016/0202608 A1*  7/2016  Namai ................ G03F 7/325
                                                           430/296
2020/0209753 A1   7/2020  Tamura et al.
(Continued)

FOREIGN PATENT DOCUMENTS

WO   2019/012716 A1   1/2019
WO   2019/059210 A1   3/2019
(Continued)

OTHER PUBLICATIONS

Sep. 7, 2021 International Search Report Issued in International Patent Application No. PCT/JP2021/022277.
(Continued)

*Primary Examiner* — Stewart A Fraser
(74) *Attorney, Agent, or Firm* — Oliff PLC

(57) ABSTRACT

A composition for protective film formation can form a flat film that satisfactorily functions as a mask (protection) against wet etchants during semiconductor substrate processing and has a low dry etching rate, the composition having satisfactory covering and recess-filling properties when applied to rugged substrates and having a small thickness difference after the recess filling. A protective film, a resist underlayer film, and a resist-pattern-coated substrate each produced using the composition; and a method for producing a semiconductor device. The composition, which is for forming films for protection against wet etchants for semiconductors, includes an organic solvent and a compound that has a molecular end having a structure including at least one pair of adjoining hydroxyl groups and has a
(Continued)

molecular weight of 1,500 or less, wherein particles present therein have an average particle diameter, as determined by a dynamic light scattering method, of 3 nm or smaller.

20 Claims, 2 Drawing Sheets

(51) Int. Cl.
*C07D 303/27* (2006.01)
*H01L 21/306* (2006.01)

(58) Field of Classification Search
CPC ............ H01L 21/31144; C07D 303/16; C07D 303/27; C07C 323/12; G03F 7/094; G03F 7/11

See application file for complete search history.

(56) References Cited

U.S. PATENT DOCUMENTS

2020/0319561 A1  10/2020  Endo et al.
2020/0333706 A1  10/2020  Serizawa et al.
2021/0149307 A1   5/2021  Hattori et al.

FOREIGN PATENT DOCUMENTS

WO    2019/124474 A1  6/2019
WO    2019/138823 A1  7/2019

OTHER PUBLICATIONS

Dec. 13, 2022 International Preliminary Report on Patentability Issued in International Patent Application No. PCT/JP2021/022277.

* cited by examiner

EXAMPLE OF DEFECTIVE EMBEDDING

EXAMPLE 1 (EXCELLENT EMBEDDING)

EXAMPLE 2 (EXCELLENT EMBEDDING)

EXAMPLE 3 (EXCELLENT EMBEDDING)

EXAMPLE 4 (EXCELLENT EMBEDDING)

EXAMPLE 5 (EXCELLENT EMBEDDING)

EXAMPLE 6 (EXCELLENT EMBEDDING)

EXAMPLE 7 (EXCELLENT EMBEDDING)

EXAMPLE 8 (EXCELLENT EMBEDDING)

PROTECTIVE FILM-FORMING COMPOSITION CONTAINING DIOL STRUCTURE

TECHNICAL FIELD

The present invention relates to a composition for forming a protective film particularly having excellent resistance to a semiconductor wet etching solution in a lithography process in manufacturing a semiconductor. In addition, the present invention relates to a method for manufacturing a substrate with a resist pattern by applying the protective film thereto and a method for manufacturing a semiconductor device.

BACKGROUND ART

In manufacturing a semiconductor, a lithography process for forming a resist pattern having a desired shape by providing a resist underlayer film between a substrate and a resist film formed on the substrate has widely been known. After forming a resist pattern, the substrate is processed, and dry etching is mainly used as a process thereof, but wet etching may be used depending on the type of the substrate. Patent Literature 1 discloses a protective film-forming composition against a semiconductor wet etching solution, which contains a solvent and a compound containing in a molecule at least one pair of two hydroxy groups adjacent to each other or a polymer thereof. Patent Literature 2 discloses a composition for a resist underlayer film superior in embeddability, which contains a resin obtained by reacting a resin containing an epoxy group with a compound containing a thiol group.

CITATION LIST

Patent Literature

Patent Literature 1: WO 2019/124474 A
Patent Literature 2: WO 2019/059210 A

SUMMARY OF INVENTION

Technical Problem

In a case where a protective film of a semiconductor substrate is formed using a protective film-forming composition and a base substrate is processed by wet etching using the protective film as an etching mask, the protective film is required to have an excellent mask function (that is, the masked portion can protect the substrate) against a semiconductor wet etching solution.

Moreover, there is also a demand for a protective film-forming composition that has a coating property even for the so-called stepped substrate, and is capable of forming a flat film having a small difference in film thickness after embedding.

Conventionally, in order to provide a resistance to SC-1 (an ammonia-hydrogen peroxide solution) which is a wet etching chemical solution, a technique of applying a low-molecular compound (for example, gallic acid) as an additive has been used, but there is a limit to solving the above problems.

Furthermore, the protective film used for the above object is expected to have a function as a resist underlayer film for solving troubles at the time of forming the so-called resist pattern (shape defect or the like).

An object of the present invention is to solve the above problems.

Solution to Problem

The present invention encompasses the followings.

[1] A protective film-forming composition against a semiconductor wet etching solution comprising:
an organic solvent, and
a compound (A) that has in a molecule at a terminal thereof a structure having at least one pair of two hydroxy groups adjacent to each other, has a weight average molecular weight of 1,500 or less, and contain no heterocyclic ring; and
wherein the protective film-forming composition comprises particles having an average particle size of 3 nm or less as determined by a dynamic light scattering method.

[2] The protective film-forming composition against a semiconductor wet etching solution according to [1], which is superior in embeddability in narrow gaps on a semiconductor substrate.

[3] The protective film-forming composition according to [1] or [2], wherein compound (A) contains an aromatic hydrocarbon or an alicyclic hydrocarbon.

[4] The protective film-forming composition according to any one of [1] to [3], wherein compound (A) has in the molecule a 1,2-ethanediol structure as the structure having at least one pair of two hydroxy groups adjacent to each other.

[5] The protective film-forming composition against a semiconductor wet etching solution according to any one of [1] to [4], wherein compound (A) has the following partial structure:

[Chem. 1]

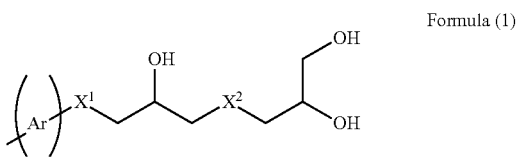

Formula (1)

in Formula (1), Ar represents a benzene ring which may be substituted with a substituent, a naphthalene ring which may be substituted with a substituent, or an anthracene ring which may be substituted with a substituent; $X^1$ represents an ether bond or an ester bond; $X^2$ represents an ether bond, an ester bond, a sulfide bond, or —$NX^3$—; and $X^3$ represents a hydrogen atom or a methyl group.

[6] The protective film-forming composition against a semiconductor wet etching solution according to [5], wherein in Formula (1), $X^1$ represents an ether bond and $X^2$ represents a sulfide bond.

[7] The protective film-forming composition according to any one of [1] to [6], further comprising an acid catalyst.

[8] A protective film, which is a baked product of a coating film of the protective film-forming composition according to any one of [1] to [7].

[9] A resist underlayer film-forming composition comprising:
an organic solvent, and
a compound (A) that has in a molecule at a terminal thereof a structure having at least one pair of two hydroxy groups adjacent to each other, has a weight average molecular weight of 1,500 or less, and contain no heterocyclic ring; and wherein the resist underlayer film-forming composition comprises particles having an average particle size of 3 nm or less as determined by a dynamic light scattering method.

[10] The resist underlayer film-forming composition according to [9], which is superior in embeddability in narrow gaps on a semiconductor substrate.

[11] The resist underlayer film-forming composition according to [9] or [10], wherein compound (A) contains an aromatic hydrocarbon or an alicyclic hydrocarbon.

[12] The resist underlayer film-forming composition according to any one of [9] to [11], wherein compound (A) has in the molecule a 1,2-ethanediol structure as the structure having at least one pair of two hydroxy groups adjacent to each other.

[13] The resist underlayer film-forming composition according to any one of [9] to [12], wherein compound (A) has the following partial structure:

[Chem. 2]

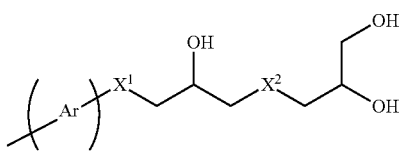

Formula (1)

in Formula (1), Ar represents a benzene ring which may be substituted with a substituent, a naphthalene ring which may be substituted with a substituent, or an anthracene ring which may be substituted with a substituent; $X^1$ represents an ether bond or an ester bond; $X^2$ represents an ether bond, an ester bond, a sulfide bond, or —$NX^3$—; and $X^3$ represents a hydrogen atom or a methyl group.

[14] The resist underlayer film-forming composition according to [13], wherein in Formula (1), $X^1$ represents an ether bond and $X^2$ represents a sulfide bond.

[15] The resist underlayer film-forming composition according to any one of [9] to [14], further comprising an acid catalyst and/or a crosslinking agent.

[16] A resist underlayer film which is a baked product of a coating film of the resist underlayer film-forming composition according to any one of [9] to [15].

[17] A method for manufacturing a substrate with a protective film, which is used for manufacturing a semiconductor, wherein the method comprises the step of applying the protective film-forming composition according to any one of [1] to [7] onto a stepped semiconductor substrate and baking the applied composition to form a protective film.

[18] A method for manufacturing a substrate with a resist pattern, which is used for manufacturing a semiconductor, wherein the method comprises the steps of:

applying the protective film-forming composition according to any one of [1] to [7] or the resist underlayer film-forming composition according to any one of [9] to [15] onto a semiconductor substrate and baking the applied composition to form a protective film as a resist underlayer film; and forming a resist film on the protective film and then performing exposure and development to form a resist pattern.

[19] A method for manufacturing a semiconductor device, comprising the steps of:

forming a protective film using the protective film-forming composition according to any one of [1] to [7] on a semiconductor substrate optionally having an inorganic film formed on a surface thereof;

forming a resist pattern on the protective film;

dry etching the protective film using the resist pattern as a mask to expose a surface of the inorganic film or semiconductor substrate; and wet etching and washing the inorganic film or semiconductor substrate with a semiconductor wet etching solution using the dry-etched protective film as a mask.

[20] A method for manufacturing a semiconductor device, comprising the steps of:

forming a resist underlayer film using the resist underlayer film-forming composition according to any one of [9] to [15] on a semiconductor substrate optionally having an inorganic film formed on a surface thereof;

forming a resist pattern on the resist underlayer film;

dry etching the resist underlayer film using the resist pattern as a mask to expose a surface of the inorganic film or semiconductor substrate; and etching the inorganic film or semiconductor substrate using the dry-etched resist underlayer film as a mask.

Advantageous Effects of Invention

The protective film-forming composition of the present invention is required to provide, for example, the following properties in good balance in a lithography process in manufacturing a semiconductor: (1) exhibiting a good mask function relative to a wet etching solution at the time of processing a base substrate, (2) additionally reducing damages to a protective film or a resist underlayer film at the time of processing a substrate by its low dry etching rate, (3) being superior in planarization of a stepped substrate, and (4) being superior in embeddability in a fine trench pattern substrate. Having a good balance between the properties (1) to (4) could facilitate fine processing of a semiconductor substrate.

DESCRIPTION OF EMBODIMENTS

<Protective Film-Forming Composition>

Figure 1:
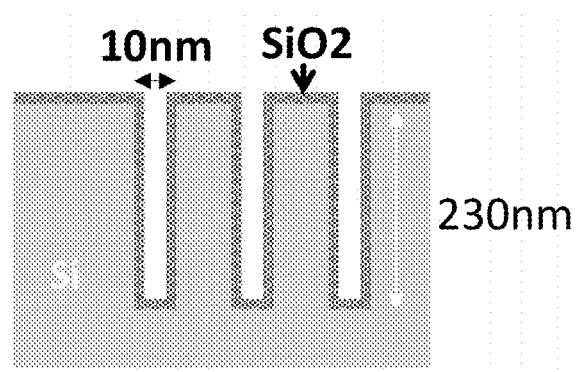
FIG. 1 is a schematic cross-sectional view of a substrate for evaluating embeddability of Example.

The protective film-forming composition of the present application is a protective film-forming composition against a semiconductor wet etching solution, containing an organic solvent, and a compound (A) that has in a molecule at a terminal thereof a structure having at least one pair of two hydroxy groups adjacent to each other, has a weight average molecular weight of 1,500 or less, and contain no heterocyclic ring; and wherein the average particle size of particles present in the composition is 3 nm or less as determined by a dynamic light scattering method. The particles are derived from a compound having a large molecular weight as described below.

The weight average molecular weight may be determined by, for example, gel permeation chromatography described in Examples.

<Average Particle Size by Dynamic Light Scattering Method>

In a case where a compound having a large molecular weight (polymer) is present in the protective film-forming composition referred to in the present application, the average particle size of the particles may be defined by a dynamic light scattering (DLS) method. Since compound (A) of the present application has a small molecular weight of 1,500 or less as compared with a polymer described in the so-called existing technique, the average particle size by DLS is 3 nm or less. More preferably, the average particle size is less than 3 nm, 2 nm or less, or 1 nm or less. The numerical value of the average particle size above indicates a numerical value of a detection limit at the time of measurement by the above DLS measuring apparatus. Attributable to such a small average particle size, the compound of the present application is superior in embeddability to a stepped semiconductor substrate, such as a fine trench pattern substrate.

It is preferable that compound (A) contains an aromatic hydrocarbon or an alicyclic hydrocarbon.

It is preferable that the structure having at least one pair of two hydroxy groups adjacent to each other in the molecule is a 1,2-ethanediol structure.

It is preferable that the compound has the following partial structure.

[Chem. 3]

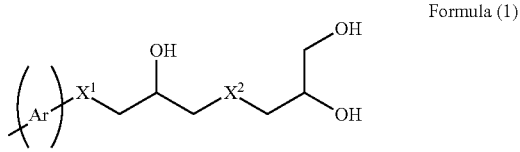

Formula (1)

in Formula (1), Ar represents a benzene ring which may be substituted with a substituent, a naphthalene ring which may be substituted with a substituent, or na anthracene ring which may be substituted with a substituent; $X^1$ represents an ether bond or an ester bond; $X^2$ represents an ether bond, an ester bond, a sulfide bond, or —$NX^3$—; and $X^3$ represents a hydrogen atom or a methyl group.

It is preferable that $X^1$ represents an ether bond and $X^2$ represents a sulfide bond.

The expression "which may be substituted with a substituent" means that some or all hydrogen atoms present in the benzene ring, naphthalene ring, or anthracene ring contained in Ar of the present application may be substituted with, for example, a hydroxy group, a halogen atom, a carboxyl group, a nitro group, a cyano group, a methylenedioxy group, an acetoxy group, a methylthio group, an amino group, or an alkoxy group having 1 to 9 carbon atoms.

Examples of the alkoxy group having 1 to 9 carbon atoms include a methoxy group, an ethoxy group, an n-propoxy group, an i-propoxy group, an n-butoxy group, an i-butoxy group, an s-butoxy group, a t-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, a 1-ethyl-2-methyl-n-propoxy group, an n-heptyloxy group, an n-octyloxy group, and an n-nonyloxy group.

<Compound (A) that has, in the Molecule at the Terminal Thereof, a Structure Having at Least One Pair of Two Hydroxy Groups Adjacent to Each Other, has a Molecular Weight of 1,500 or Less, and Contains No Heterocyclic Ring>

Compound (A) of the present application is not limited as long as it is a compound that has in a molecule at a terminal thereof a structure having at least one pair of two hydroxy groups adjacent to each other, has a molecular weight of 1,500 or less, and contain no heterocyclic ring; and preferably has a partial structure of Formula (1). As a specific example, the compound having the partial structure of Compound Formula (1) is preferably a reaction product obtained by reacting, by a known method, a compound represented by the following Formulas (a-1) to (a-43) [i.e., a compound containing, in one molecule, an aromatic hydrocarbon or an alicyclic hydrocarbon, of which the hydrogen atom(s) may be substituted with an alkyl group having 1 to 10 carbon atoms, an alkenyl group having 3 to 6 carbon atoms, and/or a ketone group, having 2 to 4 epoxy groups, which may be glycidyl ether groups, linked via an ester bond, an ether bond, an alkylene group having 1 to 10 carbon atoms, and/or a nitrogen atom], with a compound represented by the following Formulas (b-1) to (b-4) [i.e., a compound containing, in one molecule, an organic group that reacts with a thiol group, an amino group, a methylamino group, and/or an epoxy group such as a carboxy group, and having a 1,2-ethanediol structure at a terminal thereof].

[Chem. 4]

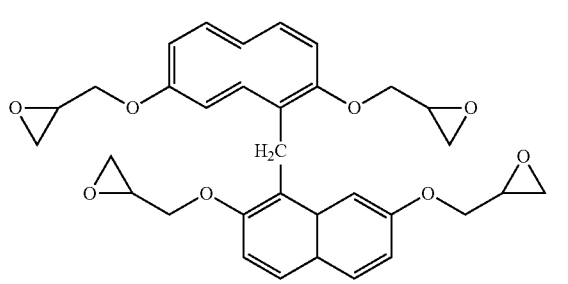

(a-1)

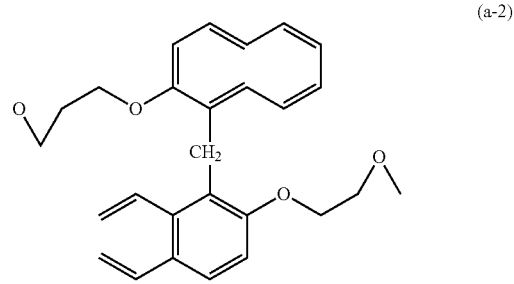

(a-2)

(a-3)
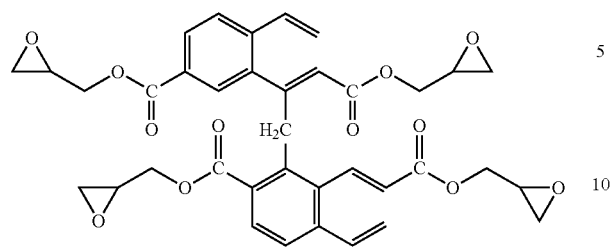
(a-7)
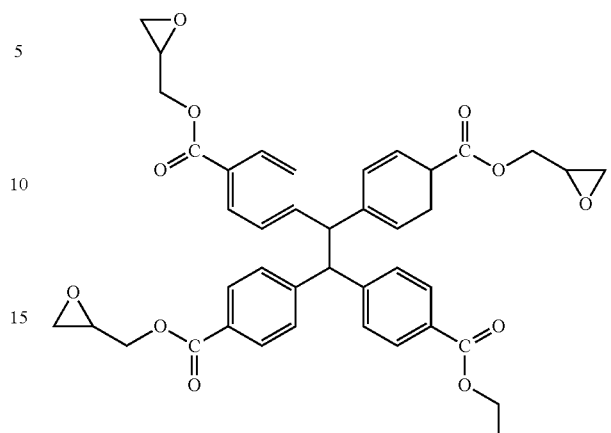
(a-4)
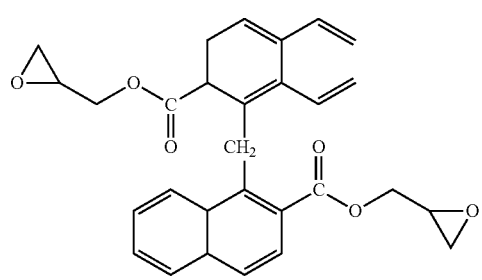
(a-5)
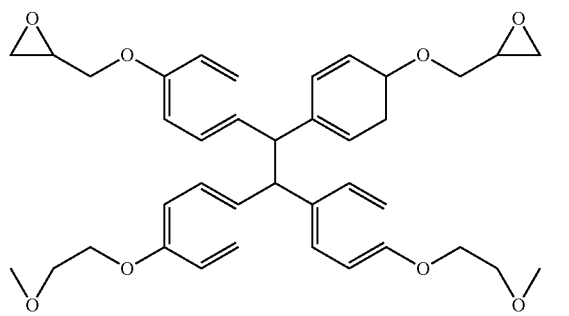
(a-8)
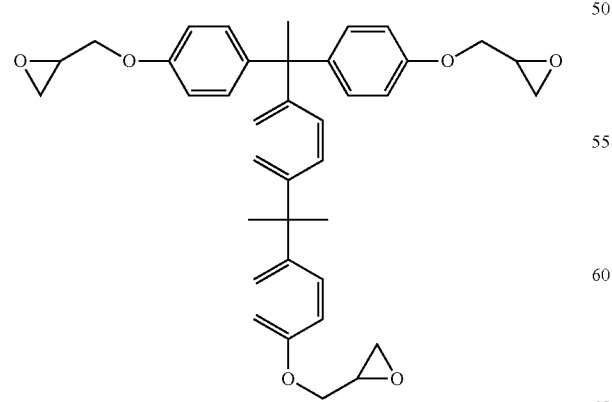
(a-6)
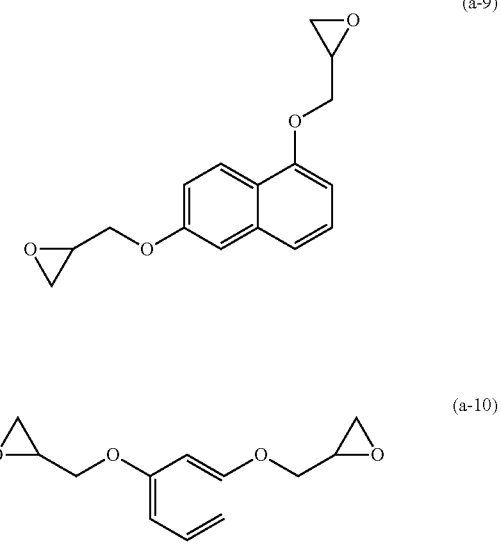
(a-9)
(a-10)

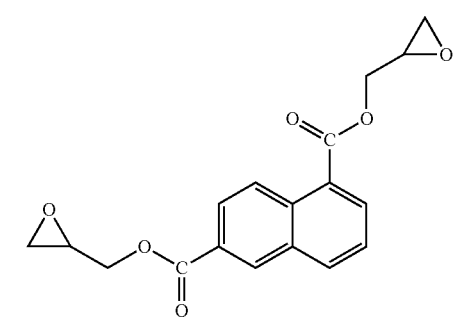
(a-11)
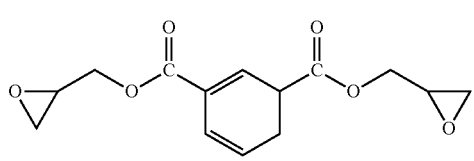
(a-12)
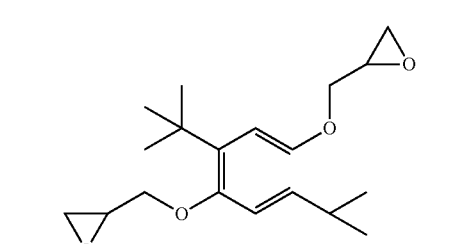
(a-13)
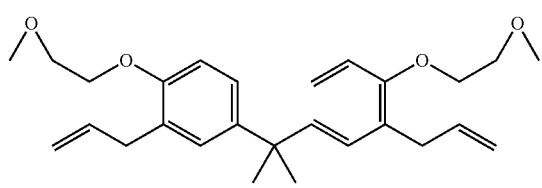
(a-14)
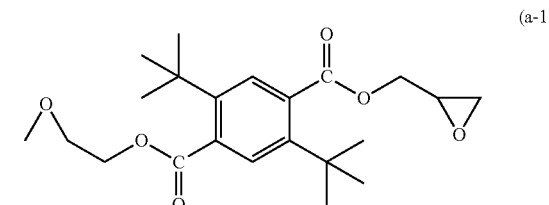
(a-15)
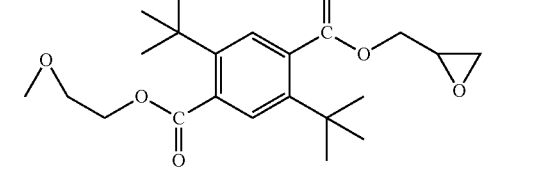
(a-16)
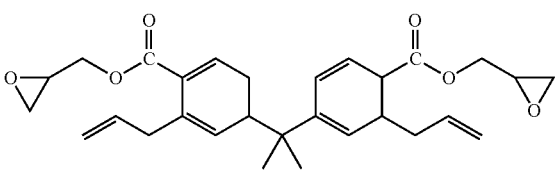
(a-17)
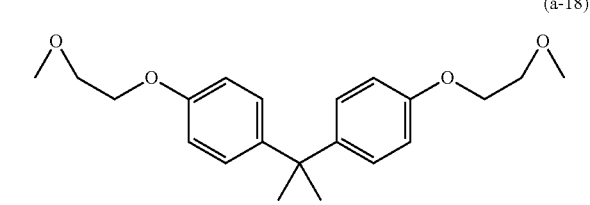
(a-18)
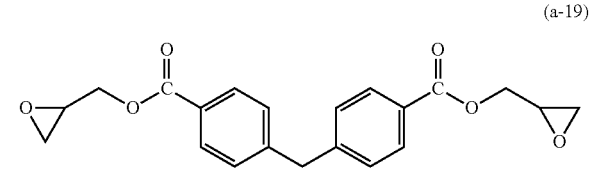
(a-19)
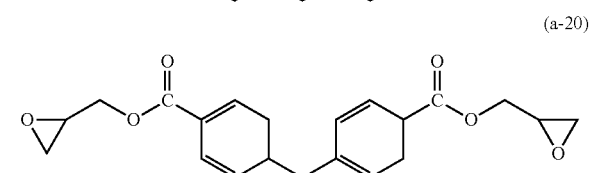
(a-20)
[Chem. 5]
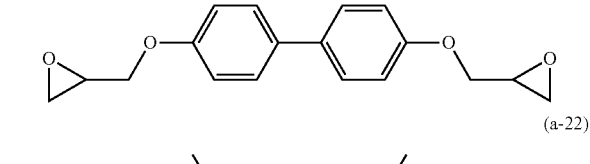
(a-21)
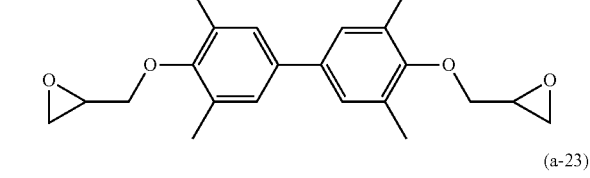
(a-22)
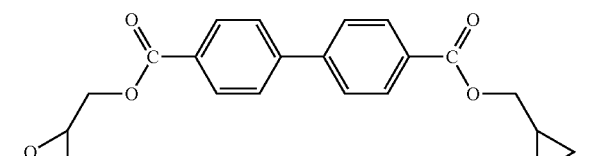
(a-23)
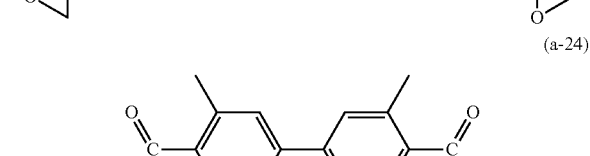
(a-24)
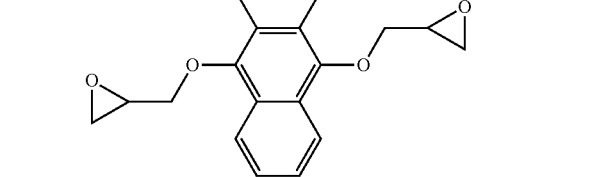
(a-25)

(a-26)
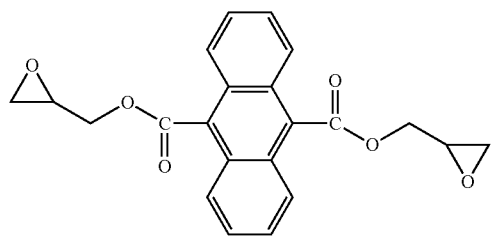
(a-27)
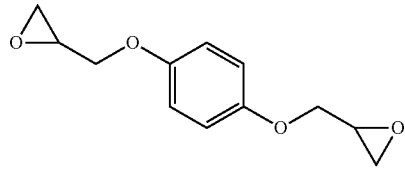
(a-28)
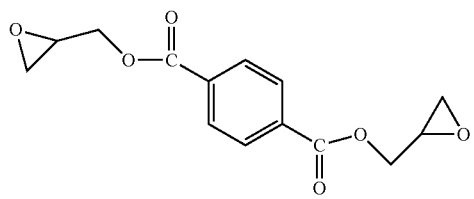
(a-29)
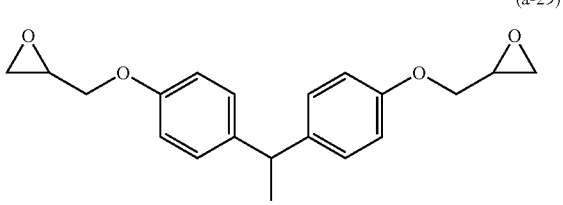
(a-30)
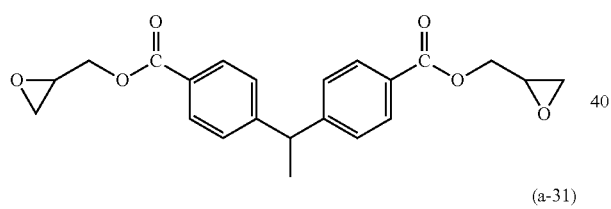
(a-31)
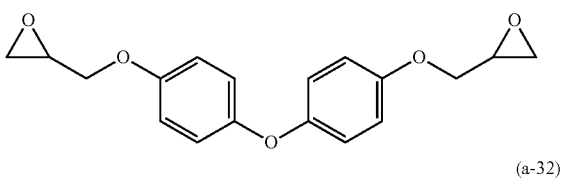
(a-32)
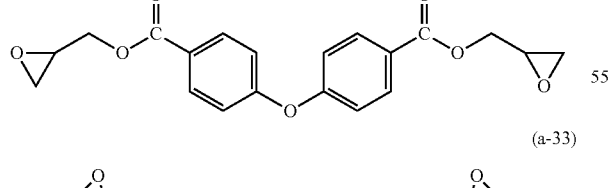
(a-33)
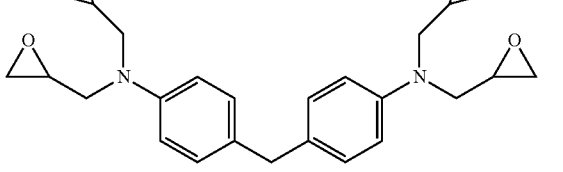
(a-34)
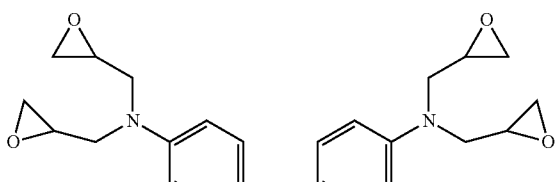
(a-35)
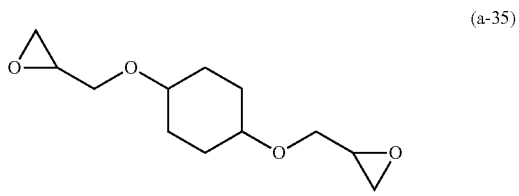
(a-36)
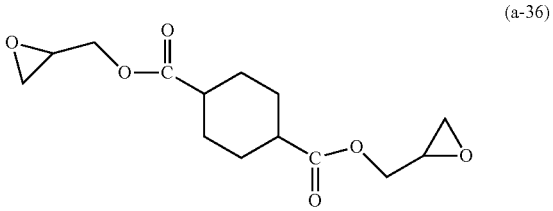
(a-37)
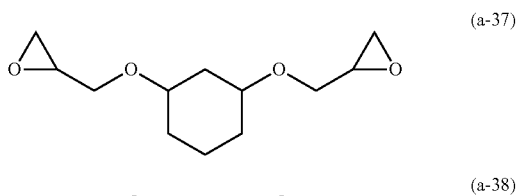
(a-38)
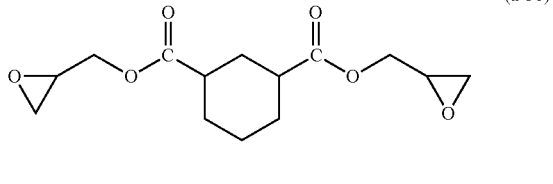
(a-39)
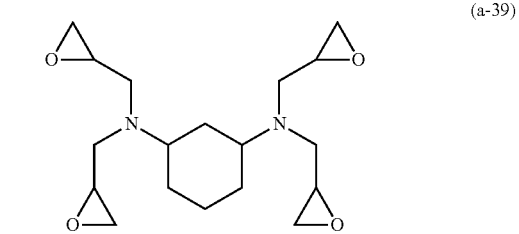
(a-40)
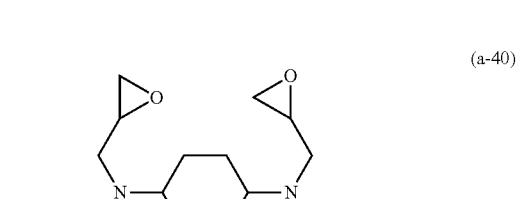

(a-41)

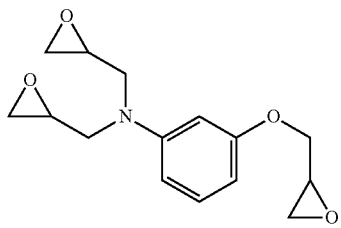

(a-42)

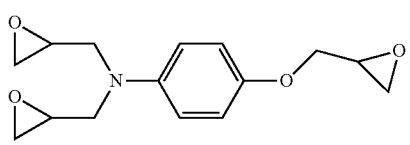

[Chem. 6]

(a-43)

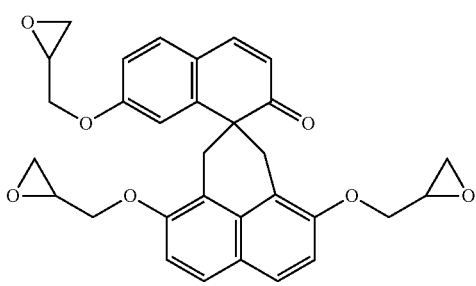

[Chem. 7]

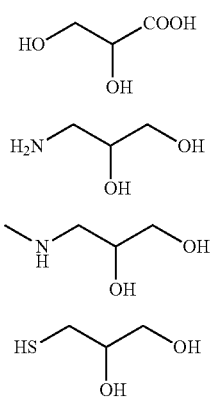

(b-1)

(b-2)

(b-3)

(b-4)

Examples of the alkyl group having 1 to 10 carbon atoms include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, a 2-ethyl-3-methyl-cyclopropyl group, and a decyl group.

Examples of the alkylene group having 1 to 10 carbon atoms include a methylene group, an ethylene group, an n-propylene group, an isopropylene group, a cyclopropylene group, an n-butylene group, an isobutylene group, an s-butylene group, a t-butylene group, a cyclobutylene group, a 1-methyl-cyclopropylene group, a 2-methyl-cyclopropylene group, an n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, a 2,2-dimethyl-n-propylene group, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, an n-hexylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-1-methyl-cyclopropylene group, a 2-ethyl-2-methyl-cyclopropylene group, a 2-ethyl-3-methyl-cyclopropylene group, an n-heptylene group, an n-octylene group, an n-nonylene group, and an n-decanylene group.

Examples of the alkenyl group having 3 to 6 carbon atoms include a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl propenyl group, a 1-pentenyl group, a 2-pentenyl group, a 3-pentenyl group, a 4-pentenyl group, a 1-n-propylethenyl group, a 1-methyl-1-butenyl group, a 1-methyl butenyl group, a 1-methyl-3-butenyl group, a 2-ethyl-2-propenyl group, a 2-methyl butenyl group, a 2-methyl-2-butenyl group, a 2-methyl-3-butenyl group, a 3-methyl butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

Of the compounds represented by Formulas (b-1) to (b-4), use of (b-4) is particularly preferable.

The weight average molecular weight of the compound having the partial structure of Formula (1) is preferably 1,500 or less, 1,400 or less, 1,200 or less, 1,000 or less, 900 or less, 800 or less, 700 or less, or 600 or less.

<Organic Solvent>

The protective film-forming composition of the present invention may be prepared by dissolving the respective components in an organic solvent, and is used in a uniform solution state.

As the organic solvent of the protective film-forming composition according to the present invention, any organic solvent may be used without particular limitation as long as it is an organic solvent capable of dissolving solid components such as the compound and an acid catalyst described below. In particular, since the protective film-forming composition according to the present invention is used in a uniform solution state, it is recommended to use an organic solvent generally used in a lithography process in combination in consideration of application performance thereof.

Examples of the organic solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propropylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. These solvents may be used each alone or in combination of two or more thereof.

Of these solvents, propylene glycol monomethyl ether, propylene glycol monomethyl ether acetate, ethyl lactate, butyl lactate, and cyclohexanone are preferable. In particular, propylene glycol monomethyl ether and propylene glycol monomethyl ether acetate are preferable.

The protective film-forming composition of the present application may further contain an acid catalyst.

As the acid catalyst, a compound that generates an acid or a base by heat may be used, in addition to an acid compound and a basic compound. As the acid compound, a sulfonic acid compound or a carboxylic acid compound may be used, and as the compound that generates an acid by heat, a thermal acid generator may be used.

Examples of the sulfonic acid compound or the carboxylic acid compound include p-toluenesulfonic acid, trifluoromethanesulfonic acid, pyridinium trifluoromethanesulfonate (=pyridinium trifluoromethanesulfonic acid), pyridinium-p-toluenesulfonate, pyridinium-4-hydroxybenzene sulfonate, salicylic acid, camphorsulfonic acid, 5-sulfosalicylic acid, 4-chlorobenzenesulfonic acid, 4-phenolsulfonic acid, pyridinium-4-phenolsulfonate, benzenedisulfonic acid, 1-naphthalenesulfonic acid, 4-nitrobenzenesulfonic acid, citric acid, benzoic acid, and hydroxybenzoic acid.

Examples of the thermal acid generator include K-PURE [registered trademark] CXC-1612, K-PURE CXC-1614, K-PURE TAG-2172, K-PURE TAG-2179, K-PURE TAG-2678, and K-PURE TAG2689 (manufactured by King Industries, Inc.) and SI-45, SI-60, SI-80, SI-100, SI-110, and SI-150 (manufactured by SANSHIN CHEMICAL INDUSTRY CO., LTD.).

These acid catalysts may be used each alone or in combination of two or more thereof. In addition, as the basic compound, an amine compound or an ammonium hydroxide compound may be used, and as the compound that generates a base by heat, urea may be used.

Examples of the amine compound include tertiary amines such as triethanolamine, tributanolamine, trimethylamine, triethylamine, tri-n-propylamine, tri-isopropylamine, tri-n-butylamine, tri-tert-butylamine, tri-n-octylamine, tri-isopropanolamine, phenyldiethanolamine, stearyldiethanolamine, and diazabicyclooctane, and aromatic amines such as pyridine and 4-dimethylaminopyridine. In addition, examples of the amine compound include primary amines such as benzylamine and n-butylamine, and secondary amines such as diethylamine and di-n-butylamine. These amine compounds may be used each alone or in combination of two or more thereof.

Examples of the ammonium hydroxide compound include tetramethylammonium hydroxide, tetraethylammonium hydroxide, tetrapropylammonium hydroxide, tetrabutylammonium hydroxide, benzyltrimethylammonium hydroxide, benzyltriethylammonium hydroxide, cetyltrimethylammonium hydroxide, phenyltrimethylammonium hydroxide, and phenyltriethylammonium hydroxide.

In addition, as the compound that generates a base by heat, for example, a compound that has a thermally unstable group such as an amide group, a urethane group, or an aziridine group and produces an amine by heating may be used. In addition, examples of the compound that generates a base by heat include urea, benzyltrimethylammonium chloride, benzyltriethylammonium chloride, benzyldimetbylphenylammonium chloride, benzyldodecyldimethylammonium chloride, benzyltributylammonium chloride, and choline chloride.

In a case where the protective film-forming composition of the present application contains an acid catalyst, a content thereof is within the range of 0.0001 to 20% by mass, preferably 0.01 to 15% by mass, and more preferably 0.1 to 10% by mass, with respect to the total solid content in the protective film-forming composition.

A solid content in the protective film-forming composition according to the present invention is usually within the range of 0.1 to 70% by mass and preferably 0.1 to 60% by mass. The solid content is a content ratio of all components excluding the solvent from the protective film-forming composition. A ratio of the polymer in the solid content is preferably in the order of 1 to 100% by mass, 1 to 99.9% by mass, 50 to 99.9% by mass, 50 to 95% by mass, and 50 to 90% by mass.

<Resist Underlayer Film-Forming Composition>

The resist underlayer film-forming composition of the present application is a resist underlayer film-forming composition containing: a compound that has a structure having at least one pair of two hydroxy groups adjacent to each other in a molecule at a terminal thereof, has a weight average molecular weight of 1,500 or less, and contain no heterocyclic ring; and an organic solvent, in which an average particle size of particles present in the composition is 3 nm or less as determined by a dynamic light scattering method.

The measurement of the weight average molecular weight and the measurement of the average particle size by the dynamic light scattering method are as described above.

It is preferable that the compound contains an aromatic hydrocarbon or an alicyclic hydrocarbon.

It is preferable that the structure having at least one pair of two hydroxy groups adjacent to each other in the molecule is a 1,2-ethanediol structure.

It is preferable that the compound has the following partial structure.

[Chem. 8]

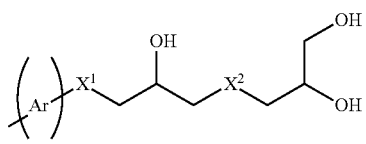

Formula (1)

in Formula (1), Ar represents a benzene ring, naphthalene ring, or anthracene ring which may be substituted with a substituent, $X^1$ represents an ether bond or an ester bond, $X^2$ represents an ether bond, an ester bond, a sulfide bond, or —$NX^3$—, and $X^3$ represents a hydrogen atom or a methyl group.

It is preferable that $X^1$ represents an ether bond and $X^2$ represents a sulfide bond.

The acid catalyst, the content of the acid catalyst, and the organic solvent are the same as those of the protective film-forming composition described above.

The solid content in the resist underlayer film-forming composition according to the present invention is usually 0.1 to 70% by mass and preferably 0.1 to 60% by mass. The solid content is a content ratio of all components excluding the solvent from the protective film-forming composition. The ratio of the polymer in the solid content is within the range of 1 to 100% by mass, 1 to 99.9% by mass, 50 to 99.9% by mass, 50 to 95% by mass, and 50 to 90% by mass, with increasing preference.

<Crosslinking Agent>

The resist underlayer film-forming composition of the present invention may contain a crosslinking agent. Examples of the crosslinking agent include a melamine-based crosslinking agent, a substituted urea-based crosslinking agent, and a polymer-based crosslinking agent thereof. Preferably, the crosslinking agent is a crosslinking agent having at least two crosslink-forming substituents, which is a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or butoxymethylated thiourea. In addition, condensates of these compounds may also be used.

In addition, as the crosslinking agent, a crosslinking agent having high heat resistance may be used. As the crosslinking agent having high heat resistance, a compound having a crosslink-forming substituent having an aromatic ring (for example, a benzene ring or a naphthalene ring) in the molecule may be used.

Examples of the compound include a compound having a partial structure of the following Formula (5-1) and a polymer or oligomer having a repeating unit of the following Formula (5-2).

[Chem. 9]

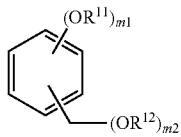

Formula (5-1)

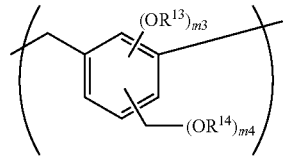

Formula (5-2)

Each of $R^{11}$, $R^{12}$, $R^{13}$ and $R^{14}$ is a hydrogen atom or an alkyl group having 1 to 10 carbon atoms, and specific examples of the alkyl group are as mentioned above.

m1 meets 1≥m1≥6-m2, m2 meets 1≥m2≥5, m3 meets 1≥m3≥4-m2, and m4 meets 1≥m4≥3.
Examples of the compound of Formula (5-1) and the polymers or oligomers of Formula (5-2) are as follows.
[Chem. 10]
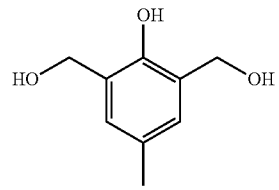
Formula (6-1)
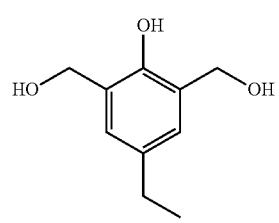
Formula (6-2)
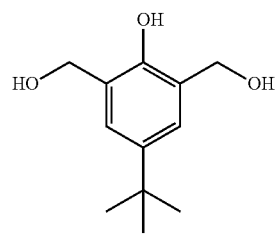
Formula (6-3)
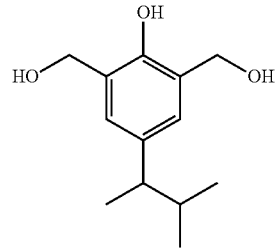
Formula (6-4)
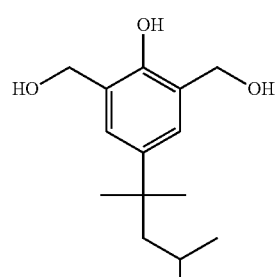
Formula (6-5)
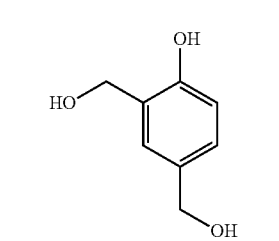
Formula (6-6)
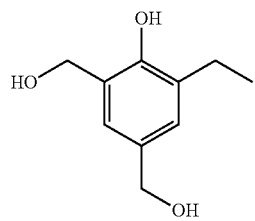
Formula (6-6)
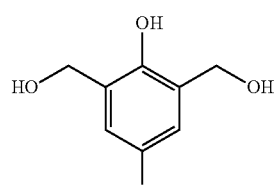
Formula (6-7)
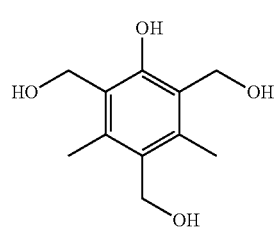
Formula (6-8)
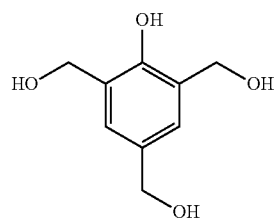
Formula (6-9)
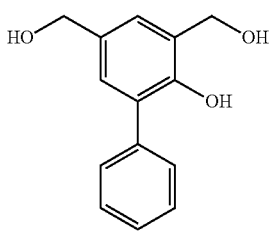
Formula (6-10)
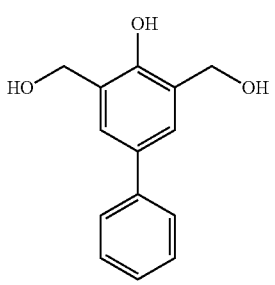
Formula (6-11)
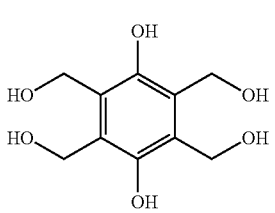
Formula (6-12)

Formula (6-13)
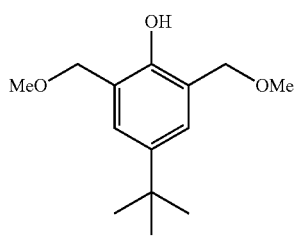

Formula (6-14)
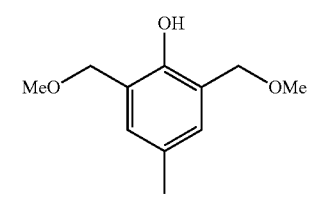

[Chem. 11]

Formula (6-15)

Formula (6-16)

Formula (6-17)

Formula (6-18)

Formula (6-19)

Formula (6-20)
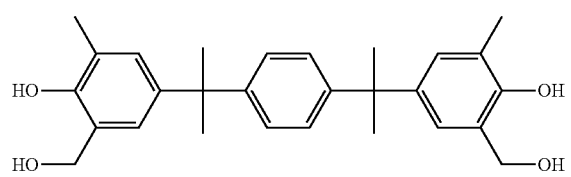

Formula (6-21)
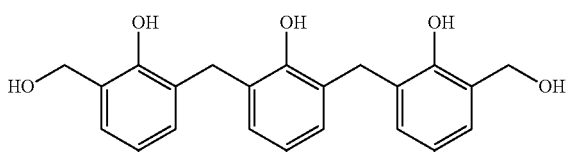

Formula (6-22)
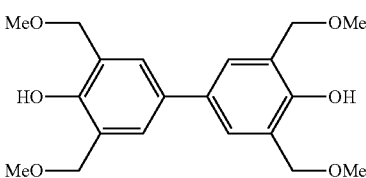

Formula (6-23)
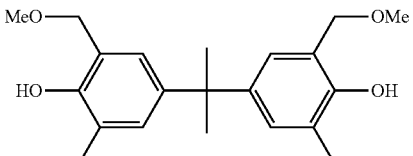

Formula (6-24)
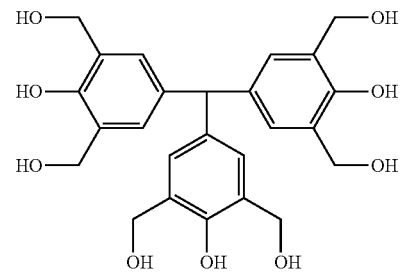

Formula (6-25)
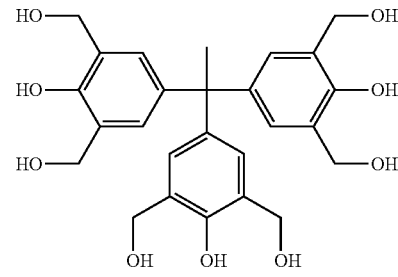

Formula (6-26)
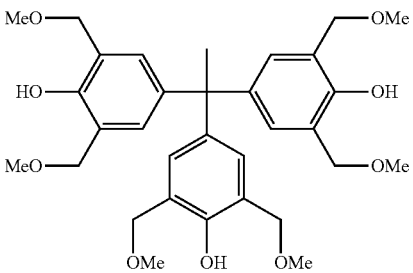

The compounds are available as products from ASAHI YUKIZAI CORPORATION and Honshu Chemical Industry Co., Ltd. For example, the compound of Formula (6-22) in the crosslinking agent is available as TMOM-BP (trade name) from ASAHI YUKIZAI CORPORATION.

The amount of the crosslinking agent added varies depending on a coating solvent to be used, a base substrate to be used, a required solution viscosity, a required film shape, and the like, and is within the range of 0.001 to 80% by mass, preferably 0.01 to 50% by mass, and more preferably 0.1 to 40% by mass, with respect to the total solid content in the protective film-forming composition. The crosslinking agent may cause a crosslinking reaction due to self-condensation. However, in a case where a crosslinkable substituent is present in the polymer of the present invention, the crosslinking agent may cause a crosslinking reaction with the crosslinkable substituent.

<Protective Film, Resist Underlayer Film, Substrate with Resist Pattern, and Method for Manufacturing Semiconductor Device>

Hereinafter, a method for manufacturing a substrate with a resist pattern using the protective film-forming composition (resist underlayer film-forming composition) and a method for manufacturing a semiconductor device according to the present invention will be described.

The substrate with the resist pattern according to the present invention may be manufactured by applying the protective film-forming composition (resist underlayer film-forming composition) onto a semiconductor substrate and performing baking.

Examples of the semiconductor substrate to which the protective film-forming composition (resist underlayer film-forming composition) of the present invention is applied include a silicon wafer, a germanium wafer, and a semiconductor wafer formed of a compound such as gallium arsenide, indium phosphide, gallium nitride, indium nitride, or aluminum nitride.

In a case where a semiconductor substrate having an inorganic film formed on a surface thereof is used, the inorganic film is formed by, for example, an atomic layer deposition (ALD) method, a chemical vapor deposition (CVD) method, a reactive sputtering method, an ion-plating method, a vacuum deposition method, or a spin coating method (spin on glass: SOG). Examples of the inorganic film include a polysilicon film, a silicon oxide film, a silicon nitride film, a silicon oxynitride film, a Boro-Phospho Silicate Glass (BPSG) film, a titanium nitride film, a titanium oxynitride film, a tungsten nitride film, a gallium nitride film, and a gallium arsenide film. The semiconductor substrate may be a stepped substrate in which the so-called vias (holes), trenches (grooves), and the like are formed. For example, the via has a substantially circular shape when viewed from an upper surface, a substantially circular diameter of the via is, for example, within the range of 1 nm to 20 nm, a depth of the via is within the range of 50 nm to 500 nm, and a width of the groove (a recess of the substrate) of the trench is, for example, within the range of 2 nm to 20 nm, and a depth of the trench is within the range of 50 nm to 500 nm. Because the compound contained in the protective film-forming composition (resist underlayer film-forming composition) of the present application has a small weight average molecular weight and average particle size, it is possible to embed the composition even in the stepped substrate as described above without a defect such as a void. It is an important advantage that there is no defect such as a void for the following process steps (wet etching/dry etching of the semiconductor substrate, or resist pattern formation) in the manufacture of a semiconductor.

The protective film-forming composition (resist underlayer film-forming composition) of the present invention is applied onto the semiconductor substrate by an appropriate application method such as a spinner or a coater. Thereafter, baking is performed using heating means such as a hot plate to form a protective film (resist underlayer film). The conditions for baking are appropriately selected from a baking temperature of 100° C. to 400° C. and a baking time of 0.3 minutes to 60 minutes. Preferably, the baking temperature is selected from 120° C. to 350° C. and the baking time is selected from 0.5 minutes to 30 minutes, and more preferably, the baking temperature is selected from 150° C. to 300° C. and the baking time is selected from 0.8 minutes to 10 minutes. The thickness of the formed protective film is, for example, within the range of 0.001 μm to 10 μm, preferably 0.002 μm to 1 μm, and more preferably 0.005 μm to 0.5 μm. When the temperature during the baking is lower than the above range, the crosslinking may be insufficient, and the resistance of the formed protective film (resist underlayer film-forming composition) to a resist solvent or a basic hydrogen peroxide aqueous solution may be hardly obtained. On the other hand, when the temperature during the baking is higher than the above range, the protective film (resist underlayer film) may be decomposed by heat.

The exposure is performed through a mask (reticle) for forming a predetermined pattern, using i rays, KrF energy lasers, ArF energy lasers, extreme ultraviolet (EUV) rays, or electron beams (EB), for example. In the development, an alkali developer is used, and the development temperature and development time are appropriately selected from 5° C. to 50° C. and 10 seconds to 300 seconds, respectively. As the alkali developer may be used, for example, aqueous solutions of alkalis, for example, inorganic alkalis such as sodium hydroxide, potassium hydroxide, sodium carbonate, sodium silicate, sodium metasilicate, and ammonia water; primary amines such as ethylamine and n-propylamine; secondary amines such as diethylamine and di-n-butyl amine; tertiary amines such as triethylamine and methyldiethylamine; alcoholamines such as dimethylethanolamine and triethanolamine; quaternary ammonium salts such as tetramethylammonium hydroxide, tetraethylammonium hydroxide, and choline; and cyclic amines such as pyrrole and piperidine. Moreover, an appropriate amount of alcohols such as isopropyl alcohol and a surfactant such as a nonionic surfactant may be added to the aqueous solution of alkalis. Of these, the preferred developer is a quaternary ammonium salt and more preferable are tetramethylammonium hydroxide and choline. Furthermore, a surfactant or the like may be added to the developer. A method of performing development with an organic solvent such as butyl acetate in place of the alkali developer, and developing the portion where an alkali dissolution rate of the photoresist is not increased may also be used.

Next, the protective film (resist underlayer film-forming composition) is dry-etched using the formed resist pattern as a mask. At this time, the surface of the inorganic film is exposed, when the inorganic film is formed on the surface of the semiconductor substrate used; and the surface of the semiconductor substrate is exposed, when the inorganic film is not formed on the surface of the semiconductor substrate used.

Thereafter, a desired pattern is formed by carrying out wet etching using a semiconductor wet etching solution using the dry-etched protective film (resist underlayer film-forming composition) (also the resist pattern in a case where the resist pattern remains on the protective film/resist underlayer film) as a mask.

As the semiconductor wet etching solution, a general chemical solution for etching a semiconductor wafer may be used, and for example, both a substance exhibiting acidity and a substance exhibiting basicity may be used.

Examples of the substance exhibiting acidity include hydrogen peroxide, hydrofluoric acid, ammonium fluoride, acidic ammonium fluoride, ammonium hydrogen fluoride, buffered hydrofluoric acid, hydrochloric acid, nitric acid, sulfuric acid, phosphoric acid, and a mixed solution thereof.

Examples of the substance exhibiting basicity include basic hydrogen peroxide aqueous solutions obtained by mixing ammonia, sodium hydroxide, potassium hydroxide, sodium cyanide, potassium cyanide, or an organic amine such as triethanolamine with aqueous hydrogen peroxide, and adjusting the pH to a basic pH. Specific examples thereof include SC-1 (ammonia-hydrogen peroxide solution). In addition, a substance capable of adjusting a pH to a basic pH, for example, a substance capable of finally adjusting a pH to a basic pH by mixing urea with a hydrogen peroxide solution and causing thermal decomposition of urea by heating to generate ammonia, may be used as a chemical solution for wet etching.

Of these, aqueous acidic hydrogen peroxide or aqueous basic hydrogen peroxide is preferable.

These chemical solutions may contain an additive such as a surfactant.

The use temperature of the semiconductor wet etching solution is desirably within the range of 25° C. to 90° C. and more desirably 40° C. to 80° C. The wet etching time is desirably within the range of 0.5 minutes to 30 minutes and more desirably 1 minute to 20 minutes.

EXAMPLES

Next, the present invention will be described in detail with reference to Examples, but the present invention is not limited thereto.

The weight average molecular weight of the compound described in the following Synthesis Example of the present description is the result of measurement by gel permeation chromatography (hereinafter, abbreviated as GPC). For the measurement, a GPC apparatus manufactured by Tosoh Corporation is used, and the measurement conditions and the like are as follows.

GPC column: Shodex [registered trademark] (Showa Denko K.K.)
Column temperature: 40° C.
Solvent: tetrahydrofuran (THF)
Flow rate: 1.0 ml/min
Standard sample: polystyrene (manufactured by Tosoh Corporation)

Synthesis Example 1

8.00 g of 1,1-bis(2,7-diglycidyloxy-1-naphthyl)methane (manufactured by DIC Corporation, product name: EPI-CLON HP-4700), 8.00 g of thioglycerol (manufactured by FUJIFILM Wako Pure Chemical Corporation), and 0.63 g of tetrabutylphosphonium bromide as a catalyst (HOKKO CHEMICAL INDUSTRY CO., LTD.) were dissolved in 78.44 g of propylene glycol monomethyl ether, and then a reaction was carried out at 110° C. for 24 hours, thereby obtaining a solution (solid content of 20% by mass) containing a reaction product. The obtained reaction product is represented by Formula (D-1). GPC analysis of the obtained reaction product showed that the product had a weight average molecular weight of 546 in terms of standard polystyrene.

[Chem. 12]

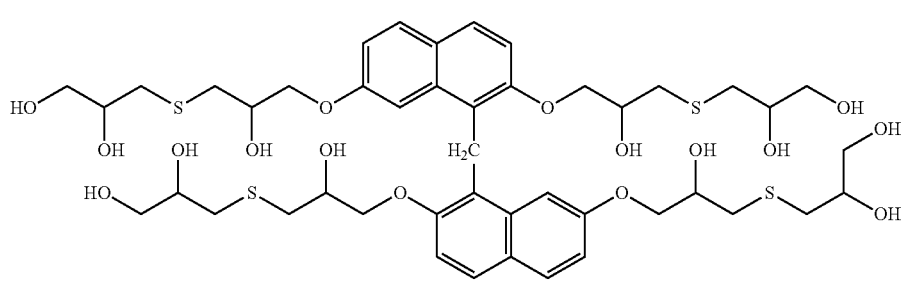

(D-1)

Synthesis Example 2

11.00 g of 1,1'-methylenebis(2-glycidyloxynaphthalene) (manufactured by DIC Corporation, product name: EPI-CLON HP-4770), 6.12 g of thioglycerol (manufactured by FUJIFILM Wako Pure Chemical Corporation), and 0.69 g of tetrabutylphosphonium bromide as a catalyst (HOKKO CHEMICAL INDUSTRY CO., LTD.) were dissolved in 71.23 g of propylene glycol monomethyl ether, and then a reaction was carried out at 110° C. for 24 hours, thereby obtaining a solution (solid content of 20% by mass) containing a reaction product. The obtained reaction product is represented by Formula (D-2). GPC analysis of the obtained reaction product showed that the product had a weight average molecular weight of 552 in terms of standard polystyrene.

[Chem. 13]

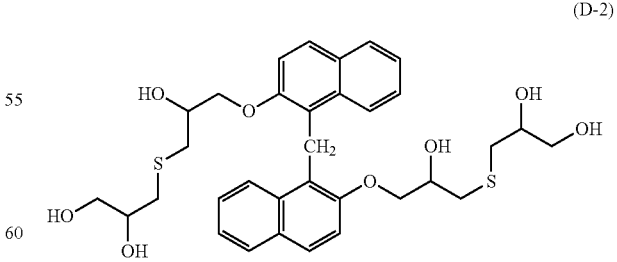

(D-2)

Synthesis Example 3

6.00 g of tetraphenylol ethane tetraglycidyl ether (manufactured by Nippon Kayaku Co., Ltd., product name:

1031S), 4.84 g of thioglycerol (manufactured by FUJIFILM Wako Pure Chemical Corporation), and 0.37 g of tetrabutylphosphonium bromide as a catalyst (HOKKO CHEMICAL INDUSTRY CO., LTD.) were dissolved in 44.81 g of propylene glycol monomethyl ether, and then a reaction was carried out at 110° C. for 24 hours, thereby obtaining a solution (solid content of 20% by mass) containing a reaction product. The obtained reaction product is represented by Formula (D-3). GPC analysis of the obtained reaction product showed that the product had a weight average molecular weight of 1,385 in terms of standard polystyrene.

[Chem. 14]

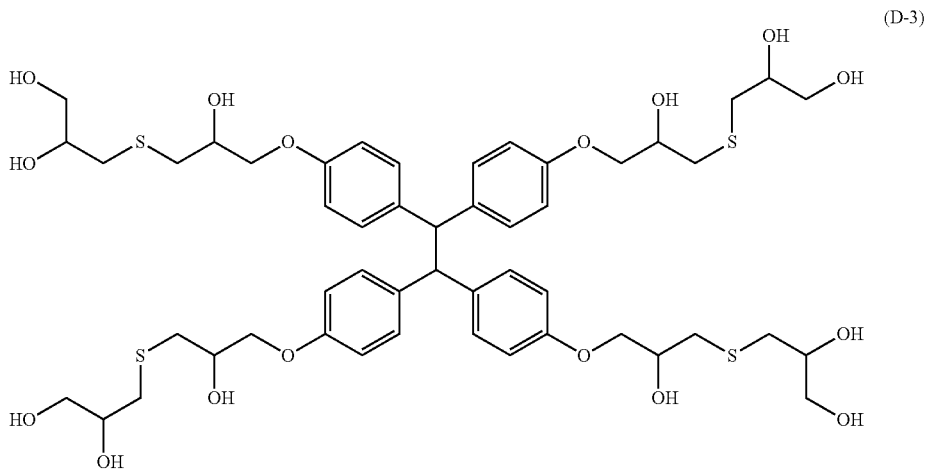

(D-3)

Synthesis Example 4

6.00 g of 2-[4-(2,3-epoxypropoxy)phenyl]-2-(4-[1,1-bis[4-([2,3-epoxypropoxy]phenyl)ethyl]phenyl]propane (manufactured by Mitsubishi Chemical Corporation, product name: NC-6000), 4.84 g of thioglycerol (manufactured by FUJIFILM Wako Pure Chemical Corporation), and 0.37 g of tetrabutylphosphonium bromide as a catalyst (HOKKO CHEMICAL INDUSTRY CO., LTD.) were dissolved in 44.81 g of propylene glycol monomethyl ether, and then a reaction was carried out at 110° C. for 24 hours, thereby obtaining a solution (solid content of 20% by mass) containing a reaction product. The obtained reaction product is represented by Formula (D-4). GPC analysis of the obtained reaction product showed that the product had a weight average molecular weight of 950 in terms of standard polystyrene.

[Chem. 15]

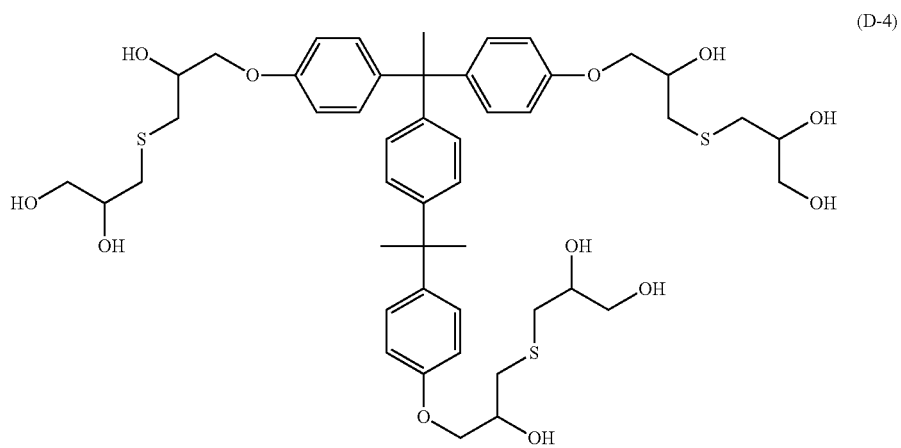

(D-4)

Synthesis Example 5

12.13 g of a commercially available epoxy resin (manufactured by DIC Corporation, product name: EPICLON HP-6000), 1.73 g of thioglycerol (manufactured by FUJIFILM Wako Pure Chemical Corporation), and 0.19 g of tetrabutylphosphonium bromide as a catalyst (HOKKO CHEMICAL INDUSTRY CO., LTD.) were dissolved in 56.20 g of propylene glycol monomethyl ether, and then a reaction was carried out at 110° C. for 24 hours, thereby obtaining a solution (solid content of 20% by mass) containing a reaction product. The obtained reaction product is represented by Formula (D-5). GPC analysis of the obtained reaction product showed that the product had a weight average molecular weight of 613 in terms of standard polystyrene.

[Chem. 16]

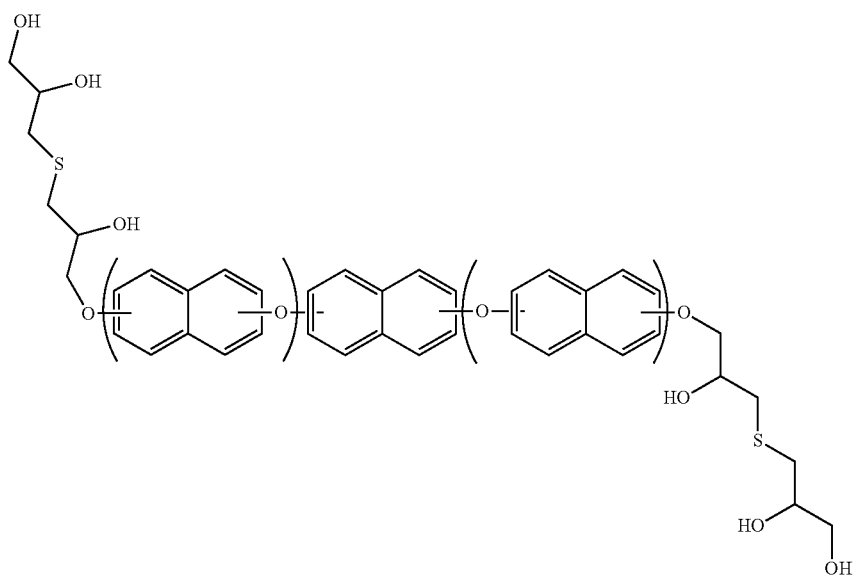

(D-5)

[Chem. 17]

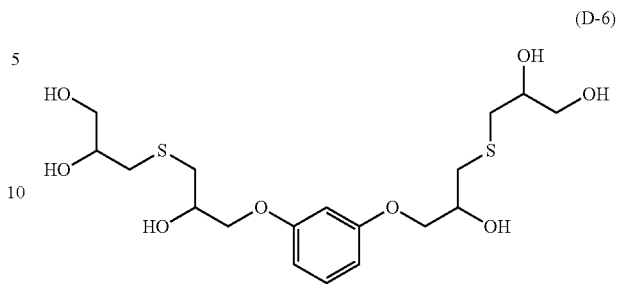

(D-6)

Synthesis Example 6

9.97 g of 1,3-diglycidyloxybenzene (manufactured by Nagase ChemteX Corporation, product name: EX-201), 10.01 g of thioglycerol (manufactured by FUJIFILM Wako Pure Chemical Corporation), and 1.12 g of tetrabutylphosphonium bromide as a catalyst (HOKKO CHEMICAL INDUSTRY CO., LTD.) were dissolved in 84.41 g of propylene glycol monomethyl ether, and then a reaction was carried out at 110° C. for 24 hours, thereby obtaining a solution (solid content of 20% by mass) containing a reaction product. The obtained reaction product is represented by Formula (D-6). GPC analysis of the obtained reaction product showed that the product had a weight average molecular weight of 482 in terms of standard polystyrene.

Synthesis Example 7

9.51 g of 1,6-naphthalenediol glycidyl ether (manufactured by DIC Corporation, product name: EPICRON (registered trademark) HP-4032D), 7.36 g of thioglycerol (manufactured by FUJIFILM Wako Pure Chemical Corporation), and 0.82 g of tetrabutylphosphonium bromide as a catalyst (HOKKO CHEMICAL INDUSTRY CO., LTD.) were dissolved in 84.64 g of propylene glycol monomethyl ether, and then a reaction was carried out at 110° C. for 24 hours, thereby obtaining a solution (solid content of 20% by mass) containing a reaction product. The obtained reaction product is represented by Formula (D-7). GPC analysis of the obtained reaction product showed that the product had a weight average molecular weight of 456 in terms of standard polystyrene.

[Chem. 18]

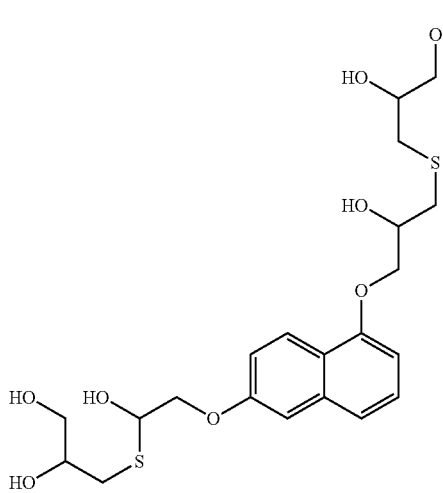

(D-7)

Synthesis Example 9

59.80 g of 1,3-diglycidyloxybenzene (manufactured by Nagase ChemteX Corporation, product name: EX-201), 14.00 g of succinic acid (Tokyo Chemical Industry Co., Ltd.), 2.85 g of thioglycerol (manufactured by FUJIFILM Wako Pure Chemical Corporation), and 3.35 g of tetrabutylphosphonium bromide as a catalyst (HOKKO CHEMICAL INDUSTRY CO., LTD.) were dissolved in 320.00 g of propylene glycol monomethyl ether, and then a reaction was carried out at 100° C. for 24 hours, thereby obtaining a solution (solid content of 20% by mass) containing a reaction product. The obtained reaction product is represented by Formula (D-9). GPC analysis of the obtained reaction product showed that the product had a weight average molecular weight of 4,772 in terms of standard polystyrene.

[Chem. 20]

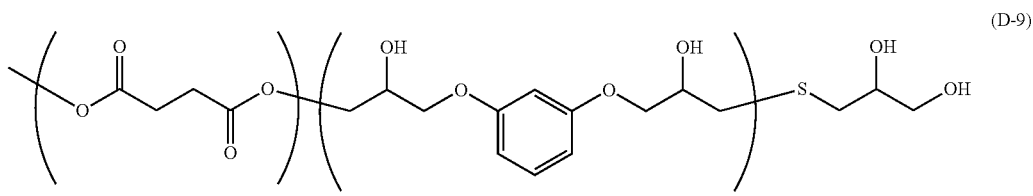

(D-9)

Synthesis Example 8

10.00 g of a hydroquinone type crystalline epoxy resin (manufactured by NIPPON STEEL Chemical & Material Co., Ltd., product name: YDC-1312), 6.45 g of thioglycerol (manufactured by FUJIFILM Wako Pure Chemical Corporation), and 0.72 g of tetrabutylphosphonium bromide as a catalyst (HOKKO CHEMICAL INDUSTRY CO., LTD.) were dissolved in 68.70 g of propylene glycol monomethyl ether, and then a reaction was carried out at 110° C. for 24 hours, thereby obtaining a solution (solid content of 20% by mass) containing a reaction product. The obtained reaction product is represented by Formula (D-8). GPC analysis of the obtained reaction product showed that the product had a weight average molecular weight of 588 in terms of standard polystyrene.

[Chem. 19]

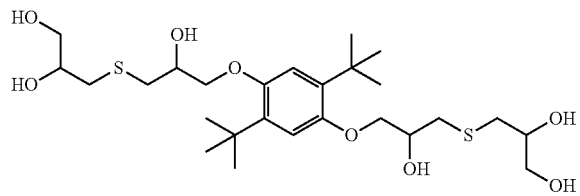

(D-8)

Example 1

To 3.20 g of a solution containing the reaction product obtained in Synthesis Example 1 were added 0.0036 g of pyridinium trifluoromethanesulfonic acid, 0.96 g of propylene glycol monomethyl ether acetate, and 5.83 g of propylene glycol monomethyl ether, thereby preparing a solution. The solution was filtered using a polyethylene microfilter having a pore size of 0.02 µm to prepare a protective film-forming composition.

Example 2

To 2.28 g of a solution containing the reaction product obtained in Synthesis Example 2 were added 0.0036 g of pyridinium trifluoromethanesulfonic acid, 0.96 g of propylene glycol monomethyl ether acetate, and 6.75 g of propylene glycol monomethyl ether, thereby preparing a solution. The solution was filtered using a polyethylene microfilter having a pore size of 0.02 µm to prepare a protective film-forming composition.

Example 3

To 4.97 g of a solution containing the reaction product obtained in Synthesis Example 3 were added 0.0053 g of pyridinium trifluoromethanesulfonic acid, 1.45 g of propylene glycol monomethyl ether acetate, and 8.58 g of propylene glycol monomethyl ether, thereby preparing a solution.

The solution was filtered using a polyethylene microfilter having a pore size of 0.02 μm to prepare a protective film-forming composition.

Example 4

To 2.61 g of a solution containing the reaction product obtained in Synthesis Example 4 were added 0.0036 g of pyridinium trifluoromethanesulfonic acid, 0.96 g of propylene glycol monomethyl ether acetate, and 6.42 g of propylene glycol monomethyl ether, thereby preparing a solution. The solution was filtered using a polyethylene microfilter having a pore size of 0.02 μm to prepare a protective film-forming composition.

Example 5

To 2.39 g of a solution containing the reaction product obtained in Synthesis Example 5 were added 0.0036 g of pyridinium trifluoromethanesulfonic acid, 0.96 g of propylene glycol monomethyl ether acetate, and 6.65 g of propylene glycol monomethyl ether, thereby preparing a solution. The solution was filtered using a polyethylene microfilter having a pore size of 0.02 μm to prepare a protective film-forming composition.

Example 6

To 3.63 g of a solution containing the reaction product obtained in Synthesis Example 6 were added 0.0041 g of pyridinium trifluoromethanesulfonic acid, 1.11 g of propylene glycol monomethyl ether acetate, and 6.76 g of propylene glycol monomethyl ether, thereby preparing a solution. The solution was filtered using a polyethylene microfilter having a pore size of 0.02 μm to prepare a protective film-forming composition.

Example 7

To 3.46 g of a solution containing the reaction product obtained in Synthesis Example 7 were added 0.0041 g of pyridinium trifluoromethanesulfonic acid, 1.11 g of propylene glycol monomethyl ether acetate, and 6.93 g of propylene glycol monomethyl ether, thereby preparing a solution. The solution was filtered using a polyethylene microfilter having a pore size of 0.02 μm to prepare a protective film-forming composition.

Example 8

To 3.46 g of a solution containing the reaction product obtained in Synthesis Example 8 were added 0.0041 g of pyridinium trifluoromethanesulfonic acid, 1.11 g of propylene glycol monomethyl ether acetate, and 6.93 g of propylene glycol monomethyl ether, thereby preparing a solution. The solution was filtered using a polyethylene microfilter having a pore size of 0.02 μm to prepare a protective film-forming composition.

Comparative Example 1

To 59.65 g of a solution containing the reaction product obtained in Synthesis Example 9 were added 0.48 g of pyridinium trifluoromethanesulfonic acid, 24.00 g of propylene glycol monomethyl ether acetate, and 165.86 g of propylene glycol monomethyl ether, thereby preparing a solution. The solution was filtered using a polyethylene microfilter having a pore size of 0.02 μm to prepare a protective film-forming composition.

<Formation of Coating Film>

Each of the protective film-forming compositions prepared in Examples 1 to 8 and the protective film-forming composition prepared in Comparative Example 1 was applied onto a silicon substrate having a surface on which a titanium nitride film was formed by spin coating, and baking was performed at 250° C. for 60 seconds, thereby preparing a coating film having a thickness of 100 nm.

<Measurement of Average Particle Size by Dynamic Light Scattering (DLS) Method>

For each of the protective film-forming compositions prepared in Examples 1 to 8 and the protective film-forming composition prepared in Comparative Example 1, the average particle size of the protective film-forming composition was measured using a particle size measuring apparatus (manufactured by Otsuka Electronics Co., Ltd., Multi-sample nanoparticle size measurement system NanoSAQLA) (detection limit: 3 nm or less) by a dynamic light scattering method (DLS method).

TABLE 1

| Example 1 | Example 2 | Example 3 | Example 4 | Example 5 | Example 6 | Example 7 | Example 8 | Comparative Example 1 |
|---|---|---|---|---|---|---|---|---|
| 3 nm or less | 3 nm or less | 3 nm or less | 3 nm or less | 3 nm or less | 3 nm or less | 3 nm or less | 3 nm or less | >5 nm |

From the results in the table, it was shown that in each of the protective film-forming compositions prepared in Examples 1 to 8, the particle size in the protective film-forming composition (varnish) was small as compared with the protective film-forming composition prepared in Comparative Example 1.

<Evaluation of Embeddability in Substrate for Evaluating Embeddability>

Each of the protective film-forming compositions prepared in Examples 1 to 8 was applied by spin coating onto a silicon processed substrate illustrated in the schematic view in FIG. 1, which carried a silicon oxide film formed on a surface of the trench, the silicon processed substrate having been prepared by depositing about 20 nm thickness of a silicon oxide film by a CVD method (after deposition of a silicon oxide film: a 10 nm trench (line (L)/space (S)) on a silicon substrate carrying a 50 nm trench (line (L)/space (S)) formed thereon, followed by baking at 250° C. for 60 seconds, to prepare a coating film having a thickness of 100 nm. Embeddability was confirmed using a cross-sectional SEM (S-4800, manufactured by Hitachi High-Technologies Corporation).

Figure 2:
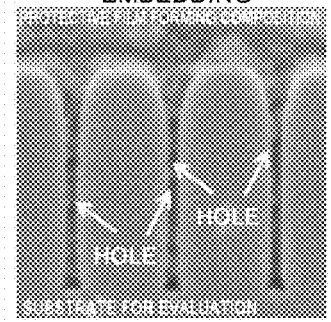
FIG. 2 is a cross-sectional SEM photograph for evaluating embeddability of a protective film-forming composition of each of Examples 1 to 8 in a stepped substrate.
Figure 2:
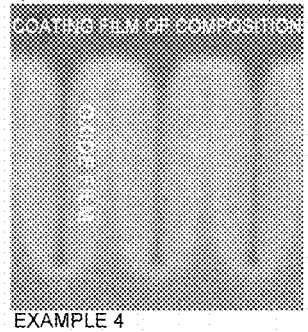
Figure 2:
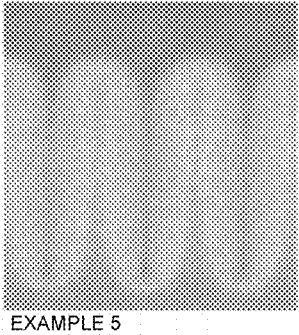
Figure 2:
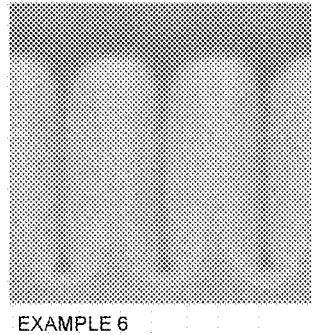
Figure 2:
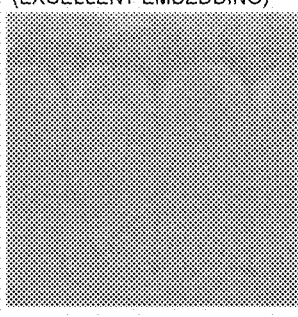
Figure 2:
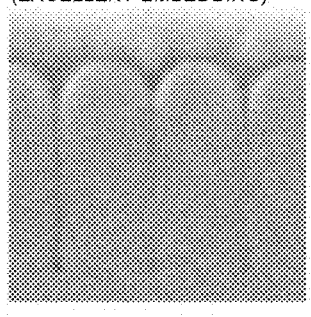

FIG. 2 shows the results of the cross-sectional SEM observation. With regard to the protective film-forming compositions of Examples, it can be seen that the compositions were embedded (portions appeared dark in the SEM photograph) in the 10 nm trench (line (L)/space (S)) substrate having gaps between the silicon oxide films that appeared white on the SEM photograph, without generation of voids. From the results of this evaluation of the embeddability, it can be expected the embeddability by the compositions of the present application will be better than that by the protective film-forming composition of Comparative Example, even for a substrate having a fine trench having a line width of 3 nm or less, for example, because the size of the compound contained in the composition of the present application is 3 nm or less.

<Test for Resistance to Basic Hydrogen Peroxide Aqueous Solution>

A coating film was prepared using each of the protective film-forming compositions prepared in Examples 1 to 8 and the protective film-forming composition prepared in Comparative Example 1 on a silicon substrate carrying a titanium nitride film formed on a surface thereof. The film was immersed for 4 minutes in a basic hydrogen peroxide aqueous solution having the composition as shown in Table 1 at the temperature shown in the same table. The film was washed with water and dried, and then the state of the film was visually observed. Table 2 shows the results. In Table 2, "○" indicates a state in which peeling is not observed in the coating film even after the treatment for 4 minutes, and "X" indicates a state in which peeling is observed in a part or the entire of the coating film after the treatment for 4 minutes.

[Table 2]

TABLE 2

| 28% by mass of ammonia aqueous solution | 33% by mass of hydrogen peroxide aqueous solution | Ultrapure water | Temperature |
|---|---|---|---|
| 40 ml | 40 ml | 80 ml | 50° C. |

TABLE 3

| Example 1 | Example 2 | Example 3 | Example 4 | Example 5 | Example 6 | Example 7 | Example 8 | Comparative Example 1 |
|---|---|---|---|---|---|---|---|---|
| ○ | ○ | ○ | ○ | ○ | ○ | ○ | ○ | X |

From the results in the table, it was shown that the coating films prepared using the protective film-forming compositions prepared in Examples 1 to 8 had sufficient resistance to a basic hydrogen peroxide aqueous solution. That is, it was found that these coating films could serve as a protective film against the basic hydrogen peroxide aqueous solution. In contrast, it was found that the coating film prepared using the film-forming composition prepared in Comparative Example 1 was insufficient as a protective film against a basic hydrogen peroxide aqueous solution.

<Test for Optical Parameters>

Each of the protective film-forming compositions (resist underlayer film-forming compositions) prepared in Examples 1 to 8 and Comparative Example 1 described in the present specification was applied onto a silicon wafer with a spinner. Baking was performed on a hot plate at 250° C. for 1 minute to form a resist underlayer film (a thickness of 50 nm). Then, an n value (a refractive index) and a k value (an attenuation coefficient or an absorption coefficient) of these protective film-forming compositions at wavelengths of 193 nm and 248 nm were measured using a spectroscopic ellipsometer (J. A. Woollam Company, VUV-VASE VU-302). Table 4 shows the results.

<Measurement of Dry Etching Rate>

Each of the protective film-forming compositions (resist underlayer film-forming compositions) prepared in Examples 1 to 8 and Comparative Example 1 described in the present specification was applied onto a silicon wafer with a spin coater. Baking was performed on a hot plate at 250° C. for 1 minute to form a resist underlayer film. Then, a dry etching rate (the amount of decrease in film thickness per unit time) was measured under a condition of using $CF_4$ as a dry etching gas using a dry etching apparatus (RIE-10NR) manufactured by SAMCO Inc.

The dry etching rate of each of the protective film-forming compositions prepared in Examples 1 to 8 described in the present specification was compared with the dry etching rate of Comparative Example 1. Table 4 shows the dry etching rate of each of the protective film-forming compositions of Examples as a selection ratio when the dry etching rate of Comparative Example 1 was taken as 1.00.

[Table 4]

TABLE 4

| | n/k @ 193 nm | n/k @ 248 nm | Selection ratio |
|---|---|---|---|
| Example 1 | 1.63/0.14 | 2.05/0.54 | 0.95 |
| Example 2 | 1.58/0.16 | 2.15/0.40 | 0.86 |
| Example 3 | 1.62/0.54 | 1.86/0.11 | 0.93 |
| Example 4 | 1.60/0.56 | 1.89/0.03 | 0.95 |
| Example 5 | 1.60/0.35 | 1.90/0.39 | 0.80 |
| Example 6 | 1.58/0.34 | 1.79/0.01 | 0.89 |
| Example 7 | 1.65/0.16 | 1.85/0.35 | 0.76 |
| Example 8 | 1.56/0.30 | 1.71/0.00 | 0.96 |
| Comparative Example 1 | 1.45/0.37 | 1.72/0.01 | 1.00 |

From the above results, when the dry etching rate of each of the protective film-forming compositions of Examples 1 to 8 described in the present specification was compared with the dry etching rate of Comparative Example 1, the dry etching rate of each of the protective film-forming compositions of Examples 1 to 8 was slower than that of Comparative Example 1.

INDUSTRIAL APPLICABILITY

The protective film-forming composition according to the present invention is superior in resistance to a wet etching solution when applied in substrate processing, and has a low dry etching rate, and therefore, it is possible to provide a protective film unlikely to be damaged during substrate processing. The resist underlayer film-forming composition according to the present invention is superior in resistance to a wet etching solution when applied in substrate processing, has a low dry etching rate, and is superior in resistance to a wet etching solution when applied in substrate processing.

The invention claimed is:

1. A protective film-forming composition against a semiconductor wet etching solution comprising:
   an organic solvent, and
   a compound (A) that has in a molecule at a terminal thereof a structure having at least one pair of two hydroxy groups adjacent to each other, has a weight average molecular weight of 1,500 or less, and contains no heterocyclic ring; and wherein the protective film-forming composition comprises particles having an average particle size of 3 nm or less as determined by a dynamic light scattering method.

2. The protective film-forming composition against a semiconductor wet etching solution according to claim 1, which is superior in embeddability in narrow gaps on a semiconductor substrate.

3. The protective film-forming composition according to claim 1, wherein compound (A) contains an aromatic hydrocarbon or an alicyclic hydrocarbon.

4. The protective film-forming composition according to claim 1, wherein compound (A) has in the molecule a 1,2-ethanediol structure as the structure having at least one pair of two hydroxy groups adjacent to each other.

5. The protective film-forming composition against a semiconductor wet etching solution according to claim 1, wherein compound (A) has the following partial structure:

[Chem. 21]

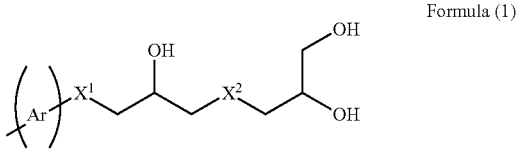

Formula (1)

in Formula (1), Ar represents a benzene ring which may be substituted with a substituent, a naphthalene ring which may be substituted with a substituent, or an anthracene ring which may be substituted with a substituent; $X^1$ represents an ether bond or an ester bond; $X^2$ represents an ether bond, an ester bond, a sulfide bond, or —$NX^3$—; and $X^3$ represents a hydrogen atom or a methyl group.

6. The protective film-forming composition against a semiconductor wet etching solution according to claim 5, wherein in Formula (1), $X^1$ represents an ether bond and $X^2$ represents a sulfide bond.

7. The protective film-forming composition according to claim 1, further comprising an acid catalyst.

8. A protective film, which is a baked product of a coating film of the protective film-forming composition according to claim 1.

9. A method for manufacturing a substrate with a protective film, which is used for manufacturing a semiconductor, wherein the method comprises the step of applying the protective film-forming composition according to claim 1 onto a stepped semiconductor substrate and baking the applied composition to form a protective film.

10. A method for manufacturing a substrate with a resist pattern, which is used for manufacturing a semiconductor, wherein the method comprises the steps of:

applying the protective film-forming composition according to claim 1 onto a semiconductor substrate and baking the applied composition to form a protective film as a resist underlayer film; and forming a resist film on the protective film and then performing exposure and development to form a resist pattern.

11. A method for manufacturing a semiconductor device, comprising the steps of:

forming a protective film using the protective film-forming composition according to claim 1 on a semiconductor substrate optionally having an inorganic film formed on a surface thereof;

forming a resist pattern on the protective film;

dry etching the protective film using the resist pattern as a mask to expose a surface of the inorganic film or semiconductor substrate; and wet etching and washing the inorganic film or semiconductor substrate with a semiconductor wet etching solution using the dry-etched protective film as a mask.

12. A resist underlayer film-forming composition comprising:

an organic solvent, and a compound (A) that has in a molecule at a terminal thereof a structure having at least one pair of two hydroxy groups adjacent to each other, has a weight average molecular weight of 1,500 or less, and contains no heterocyclic ring; and wherein the resist underlayer film-forming composition comprises particles having an average particle size of 3 nm or less as determined by a dynamic light scattering method.

13. The resist underlayer film-forming composition according to claim 12, which is superior in embeddability in narrow gaps on a semiconductor substrate.

14. The resist underlayer film-forming composition according to claim 12, wherein compound (A) contains an aromatic hydrocarbon or an alicyclic hydrocarbon.

15. The resist underlayer film-forming composition according to claim 12, wherein compound (A) has in the molecule a 1,2-ethanediol structure as the structure having at least one pair of two hydroxy groups adjacent to each other.

16. The resist underlayer film-forming composition according to claim 12, wherein compound (A) has the following partial structure:

[Chem. 22]

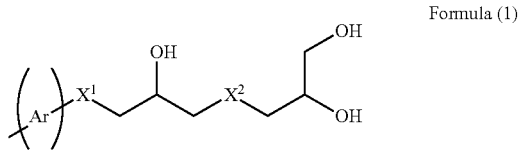

Formula (1)

in Formula (1), Ar represents a benzene ring which may be substituted with a substituent, a naphthalene ring which may be substituted with a substituent, or an anthracene ring which may be substituted with a substituent; $X^1$ represents an ether bond or an ester ond; $X^2$ represents an ether bond, an ester bond, a sulfide bond, or —$NR^3$—; and $X^3$ represents a hydrogen atom or a methyl group.

17. The resist underlayer film-forming composition according to claim 16, wherein in Formula (1), $X^1$ represents an ether bond and $X^2$ represents a sulfide bond.

18. The resist underlayer film-forming composition according to claim 12, further comprising an acid catalyst and/or a crosslinking agent.

19. A resist underlayer film which is a baked product of a coating film of the resist underlayer film-forming composition according to claim 12.

20. A method for manufacturing a semiconductor device, comprising the steps of:

forming a resist underlayer film using the resist underlayer film-forming composition according to claim 12 on a semiconductor substrate optionally having an inorganic film formed on a surface thereof;

forming a resist pattern on the resist underlayer film;

dry etching the resist underlayer film using the resist pattern as a mask to expose a surface of the inorganic film or semiconductor substrate; and etching the inorganic film or semiconductor substrate using the dry-etched resist underlayer film as a mask.

* * * * *